United States Patent [19]

Amada et al.

[11] 4,345,215
[45] Aug. 17, 1982

[54] AUDIO FREQUENCY POWER AMPLIFIER CIRCUIT

[75] Inventors: Nobutaka Amada; Shigeki Inoue, both of Toyokawa, Japan

[73] Assignee: Hitachi, Ltd., Tokyo, Japan

[21] Appl. No.: 181,763

[22] Filed: Aug. 27, 1980

[30] Foreign Application Priority Data

Aug. 31, 1979 [JP] Japan ................................ 54-110399

[51] Int. Cl.$^3$ ............................................. H03F 3/30
[52] U.S. Cl. ..................................... 330/268; 330/264
[58] Field of Search ............... 330/264, 267, 268, 269, 330/273, 274

[56] References Cited

U.S. PATENT DOCUMENTS 3,995,228 11/1976 Pass ...................................... 330/265

Primary Examiner—James B. Mullins
Attorney, Agent, or Firm—Craig and Antonelli

[57] ABSTRACT

An audio frequency power amplifier circuit comprising a voltage detector for detecting the voltage between the gates of output MOS FETs in Class B push-pull connection, and a bias generator for applying a quiescent bias voltage to the MOS FETs. The bias voltages applied to the MOS FETs are changed in proportion to the output current in such a manner that the output MOS FET to be cut off is impressed with a substantially equal bias voltage in the absence of signal. In this way, the cut off of the push-pull transistor of Class B operation is prevented, thus preventing a switching distortion.

3 Claims, 7 Drawing Figures

AUDIO FREQUENCY POWER AMPLIFIER CIRCUIT

BACKGROUND OF THE INVENTION

The present invention relates to a push-pull output circuit in an audio output amplifier, or more in particular to a Class B push-pull output amplifier like a Class A amplifier which is not cut off.

Generally, the output stage of an audio output amplifier uses a push-pull output circuit of the Class A or B complementary type in view of the recent trend toward larger output and higher performance. The Class B push-pull output circuit has a higher efficiency than the Class A push-pull output circuit and therefore is used in most output power amplifiers. In spite of this advantage, the Class B push-pull output circuit has the disadvantage that a switching distortion is caused by repetition of on-off operation of output transistors in negative and positive phases of a signal. Specifically, in the Class B push-pull output circuit, the two output transistors in push-pull connection are prevented from producing a crossover distortion by applying a forward bias voltage to the two output transistors in such a manner that a slight amount of current flows simultaneously in the two output transsistors in the absence of a signal. In the case where the input signal voltage applied to the input terminal of the output transistor is of such a polarity as to reversely bias the output transistor, however, the output transistor is cut off when the input signal voltage gradually increases to a level exceeding the forward bias voltage applied to the output transistor.

Thus the Class B push-pull output power amplifier circuit is such that the output transistors are turned on and off alternately every positive and negative half cycles of the input signal. With the increase in signal frequency, the time delay for transferring from on to off state or from off to on state becomes considerably long, thus causing a switching distortion. Since this switching distortion contains very high harmonics, the improvement by negative feedback is substantially offset. For this reason, the only method of reducing the switching distortion is to use a high speed element capable of high-speed on-off switching operation. Even if a MOS FET which is the highest speed element available at the present is used, however, it is impossible to completely eliminate the time delay, and the switching distortion is not essentially avoided in Class B operation.

The Class A operation in which the output transistor is not cut off through the time range of the input signal and therefore the switching distortion is not caused, is low in efficiency, thus making it practically unsuitable for a large output amplifier.

If a circuit is configured not to cut off the output transistor over the entire time range of the input signal like the Class A circuit while at the same time retaining the feature of the Class B circuit high in power efficiency, it is possible to obtain a push-pull amplifier high in efficiency which does not cause any switching distortion. Such an amplifier is disclosed, for instance, in U.S. Pat. No. 3,995,228, as the basic circuit thereof is shown in FIG. 1. In this circuit, two output transistors $Q_1$ and $Q_2$ of emitter follower type and drive transistors $Q_5$ and $Q_6$ for driving the transistors $Q_1$ and $Q_2$ make up a Class B push-pull circuit. The voltage $V_{BE}$ representing the total sum of the base-emitter voltages $V_{BE1}$, $V_{BE2}$ of two output transistors $Q_1$, $Q_2$ and the base-emitter voltages $V_{BE5}$, $V_{BE6}$ of two drive transistors $Q_5$, $Q_6$ is generated by two $V_{BE}$ multiplier transistors $Q_3$ and $Q_4$. Thus a crossover distortion is prevented from being generated in such a manner that the output transistors $Q_1$, $Q_2$ and the drive transistors $Q_5$, $Q_6$ are conducted by the generated $V_{BE}$ voltage in the absence of an incoming signal applied to an input terminal $V_{IN}$. In order to produce a quiescent bias voltage supplied to the four transistors $Q_1$, $Q_2$, $Q_5$ and $Q_6$, the current flowing in a resistor $R_2$ due to the base-emitter voltages $V_{BE3}$ and $V_{BE4}$ of the two transistors $Q_3$ and $Q_4$ which are applied across the resistor $R_2$ is supplied to two other resistors $R_1$ and $R_3$, thereby attaining a voltage drop across each of the three resistors $R_1$, $R_2$ and $R_3$.

The operation in response to an incoming signal will be described. Assuming that a positive input signal is applied to the input terminal $V_{IN}$, the emitter current of the output transistor $Q_1$ increases which in turn increases the voltage drop across an emitter resistor $R_{E1}$. Also, the base-emitter voltage of the output transistor $Q_1$ slightly increases, thus increasing the voltage between nodes A and Z. In view of the fact that voltage at a node X is clamped to the voltage at the node Z by a constant-voltage source $V_X$, namely, the voltage at the node X is fixed at a voltage which is the sum of an output voltage $V_{OUT}$ of this circuit and the voltage of the constant voltage source $V_X$, the current flowing through the resistor $R_1$ increases thereby increasing the voltage drop across the resistor $R_1$, thus increasing the bias voltage between the node A and a node B. The voltage at a node Y is clamped to the voltage at the node Z by a constant-voltage source $V_Y$, and therefore does not change with the increase in the voltage between the nodes A and Z, so that the voltage between the nodes B and Z does not change. As a result, a quiescent current flows in the transistors $Q_2$ and $Q_6$ during the absence of an input signal and therefore these transistors are not cut off. Thus, upon application of a negative signal voltage to the input terminal $V_{IN}$, it is immediately amplified thereby to prevent a switching distortion from being caused. This circuit is required to change the bias voltage by use of an input signal current, and therefore has the disadvantage that it is impossible to produce a satisfactory large output. Specifically, when the voltage between the nodes A and Z increases by the input signal voltage, the current flowing in the resistor $R_1$ is required to be increased in order to increase the voltage drop across the resistor $R_1$. As this increment current, the input signal current is used. Thus, the input signal used for amplification decreases by the value flowing in the resistor $R_1$ thereby making it impossible to produce a large output. The attenuation of the input signal means the reduction in the open loop gain of the amplifier, thus leading to the shortcomings of a decreased negative feedback and increased distortion for a closed loop.

SUMMARY OF THE INVENTION

Accordingly, it is an object of the present invention to provide a Class B push-pull amplifier in which the bias voltage is changed in accordance with the input signal voltage without attenuating the input signal.

According to the present invention, there is provided an output power amplifier comprising a pair of output transistors of push-pull complementary type, a pair of drive transistors for driving the output transistors in emitter-follower form, first and second resistors connected between the emitters and the loads of the drive transistors respectively, means for taking out the change in the voltage between the emitters of the drive transistors as a change in voltage drop across the first and second resistors, a pair of voltage detection transistors of different conduction types, means for supplying the voltage across the first and second resistors between the base and emitter of the voltage detection transistors respectively, thereby generating a voltage according to an emitter current across an emitter resistor connected to the emitter of each of the voltage detection transistors, a constant-voltage bias source connected between the bases of the drive transistors, means for adding the voltage at the emitter resistor to the constant-voltage bias source, and means for supplying between the bases of the drive transistors the voltage increment between the input terminals of the output transistors increased by the input signal voltage, thereby preventing the cut off.

DESCRIPTION OF THE PREFERRED EMBODIMENTS

Figure 1:
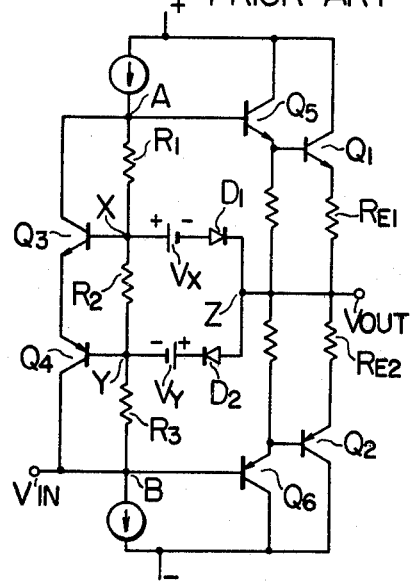
FIG. 1 is a circuit diagram showing a prior art push-pull amplifier.
Figure 2:
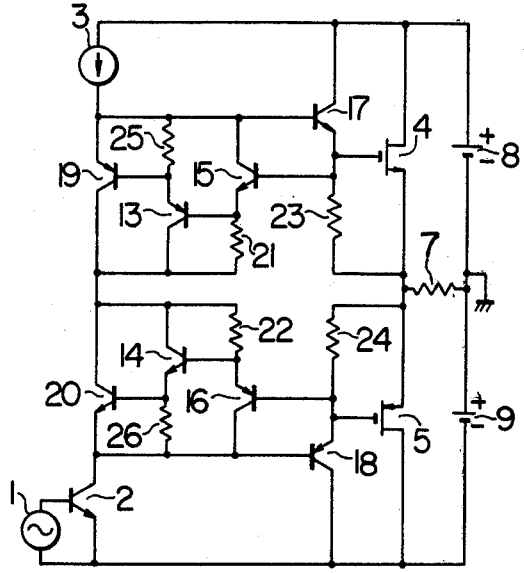
FIG. 2 is a circuit diagram showing an output power amplifier according to an embodiment of the present invention.

An output power amplifier according to an embodiment of the present invention will be described below with reference to FIG. 2. In FIG. 2, reference numeral 1 shows an audio frequency signal source, an end of which is connected to the base of a small signal amplification transistor 2, the other end thereof being connected to the negative terminal of a power supply 9. The emitter of the transistor 2 is connected to the negative terminal of the power supply 9, and the collector thereof is connected to the base of a drive transistor 18. Numerals 4 and 5 show output MOS FETs of different conduction types, the sources of which are coupled with each other and also connected to a load 7. The drain of the MOS FET 4 is connected to the positive terminal of the power supply 9, and the gate thereof is connected to the emitter of a drive transistor 17. The drain of the MOS FET 5 is connected to the negative terminal of the power supply 9, and the gate thereof is connected to the emitter of the drive transistor 18. The collector of the drive transistor 17 is connected to the positive terminal of the power supply 8, while the emitter thereof is connected via an emitter transistor 23 to the source of the FET 4 and also to the base of a first voltage detection transistor 15. The collector of the drive transistor 18 is connected to the negative terminal of the power supply 9, and the emitter thereof is connected to the source of the FET 5 via an emitter resistor 24 and also to the base of a second voltage detection transistor 16. The emitter of the first voltage detection transistor 15 and the emitter of the second voltage detection transistor 16 are connected to each other through resistors 21 and 22. The collector of the transistor 15 is connected to the base of the transistor 17, and the emitter thereof is connected to the base of a first constant-voltage transistor 13. The collector of the transistor 16 is connected to the base of the tansistor 18, and the emitter thereof is connected to the base of a third constant-voltage transistor 14. The emitter of the transistor 15 is connected to the collector of the transistor 13 via the resistor 21, and the emitter of the transistor 16 is connected to the collector of the transistor 14 via the resistor 22. The emitter of the transistor 13 is connected to the base of the transistor 17 via a resistor 25 and also to the base of a second constant-voltage transistor 19. The collector of the transistor 13 is connected to the collector of the transistor 19. The emitter of the transistor 14 is connected to the base of the transistor 18 via a resistor 26 and also to the base of a fourth constant-voltage transistor 20. The collector of the transistor 14 is connected to the collector of the transistor 20. The emitter of the transistor 19 is connected to the base of the transistor 17 and to the constant-current source 3. The collector of the transistor 19 is connected to the collector of the transistor 20. The emitter of the transistor 20 is connected to the base of the transistor 18 and at the same time to the collector of the small signal amplification transistor 2.

In the absence of the input signal in this circuit, a voltage $4V_{BE}+V_{21}+V_{22}$ equal to the sum of the base-emitter voltages $4V_{BE}$ of the four constant-voltage transistors 13, 14, 19 and 20 and voltages $V_{21}$ and $V_{22}$ across the two emitter resistors 21 and 22 is supplied between the base of the drive transistor 17 and the base of the other drive transistor 18, so that the transistors 17, 18 and MOS FETs 4, 5 are forward biased. Thus a quiescent current is flowing in these transistors. Under this condition, assume that an audio frequency signal is applied from the signal source 1. The signal from the signal source 1 is amplified at the transistor 2 and produced at the collector of the transistor 2. Explanation will be made about the case in which a signal of positive half cycle is produced at the collector of the transistor 2. The signal voltage of positive half cycle appeared at the collector of the transistor 2 acts as a forward bias voltage for the transistor 17 and MOS FET 4, and a reverse bias voltage for the transistor 18 and MOS FET 5. In other words, the positive input signal voltage positively increases the base voltage of the transistor 17 and 18. Therefore, in order to maintain the on state of the transistor 18, the voltage between the base of the transistor 17 and the base of the transistor 18 is required to be increased by the amount equal to the input signal voltage in a manner to apply a forward bias voltage to the transistor 18.

Upon application of a positive signal to the base of the transistor 17, the emitter current of the transistor 17 increases and the emitter voltage thereof also increases. As a result, the gate-source voltage of the FET 4 increases, and the source current of the FET 4 also increases, thus inducing an amplified output signal at the load 7. This is a signal amplifying operation similar to that of the ordinary amplifier. Next, the bias voltage will be explained. With the increase in the emitter current of the transistor 17, the voltage drop across the resistor 23 also increases, thus increasing the voltage between the base of the transistor 15 and the base of the transistor 16. When the voltage between the bases of the transistors 15 and 16 increases, the voltage between the emitter of the transistor 15 and the emitter of the transistor 16 also increases. This is for the reason that the voltage between the emitters of the transistors 15 and 16 is equal to the voltage between the bases of the two transistors 15 and 16 less the base-emitter voltage $V_{BE15}$ of the transistor 15 and the base-emitter voltage $V_{BE16}$ of the transistor 16. The voltage between the bases of the two drive transistors 17 and 18 is equal to the sum of the voltage between the emitters of the transistors 15 and 16, the base-emitter voltages $V_{BE13}$, $V_{BE19}$ of the two transistors 13, 19 and the base-emitter voltages $V_{BE14}$, $V_{BE20}$ of the two transistors 14, 20 respectively. These base-emitter voltages are constant and therefore the voltage between the bases of the drive transistors 17 and 18 increases by the amount of increase in the voltage between the emitters of the transistors 15 and 16. This voltage increase is caused by the increase in the voltage drop across the resistor 22. This operation will be explained below.

Even though the increase in the emitter current of the transistor 17 increases the voltage between the bases of the transistors 15 and 16, the emitter-collector voltage of the transistor 15 is equal to the sum of the base-emitter voltages $V_{BE13}$ and $V_{BE19}$ of the transistors 13 and 19 respectively and is constant. On the other hand, the increase in the signal current of the transistor 17 increases the base-emitter voltage $V_{BE17}$ thereof, so that the base-emitter voltage of the transistor 15 drops thereby reducing the emitter current of the transistor 15. Thus the voltage increase of the bases of the transistors 15 and 16 represents directly the voltage increase between base and emitter of the transistor 16, so that the emitter current of the transistor 16 increases thus increasing the voltage drop across the resistor 22. The increased emitter current of the transistor 16 is supplied under the condition where the current that has thus far flowed in the transistors 14 and 20 branches into the transistor 16. In this way, the voltage drop across the resistor 22 increases by the amount of increase in the gate-source voltage of the FET 4 and the base-emitter voltage of the transistor 17 during a positive half cycle of the input signal, so that the voltage between the bases of the transistors 17 and 18 increases. Thus a forward voltage is applied to the transistor 18 and FET 5, thus preventing the transistor from being cut off. Since the increased emitter current of the transistor 16 is supplied while dividing the current flowing in the transistors 14 and 20, no signal flows in the transistor 16, thus preventing the input signal from being attenuated.

This is also the case with the negative half cycle of the input signal. In this case, the increase in the emitter current of the transistor 18 increases the voltage drop across the resistor 24, whereby the emitter current of the transistor 15 increases so that the voltage drop across the resistor 21 increases, thus increasing the voltage between the bases of the transistors 17 and 18. The increased emitter current of the transistor 15 is supplied by the fact that the current flowing in the transistors 13 and 19 branches into the transistor 15.

Figure 3:
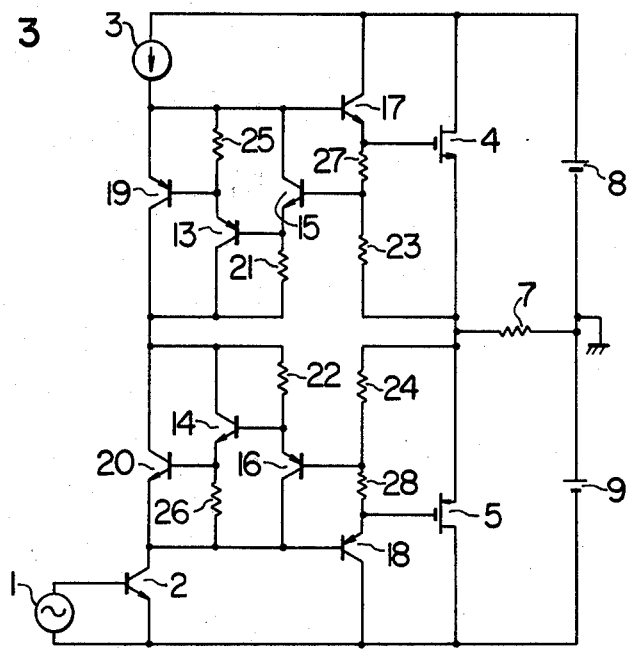
FIG. 3 is a circuit diagram showing an output power amplifier according to another embodiment of the present invention.

An improvement in the output amplifier circuit of FIG. 2 according to another embodiment of the present invention is shown in FIG. 3. In the circuit of FIG. 2, the base-emitter voltages of the two transistors 13 and 19 less the base-emitter voltage of the transistor 17 are applied between the base and emitter of the transistor 15, so that the current flowing in the transistor is excessive, thereby making it impossible to take a large resistance value of the resistor 21. This is also the case with the transistor 16 and the resistor 22. The sum of the currents flowing in the transistors 13, 15 and 19 or transistors 14, 16 and 20, however, is fixed by the constant-current supply 3, and therefore if the resistance value of the resistors 21 and 22 is small, the current flowing in the transistors 14 and 20 or transistors 13 and 19 undergoes a great change at the time of signal application, which in turn causes a change in the base-emitter voltage. If this condition is not corrected, it is difficult to attain the desired operation. If the value of the resistors 21 and 22 is not too large, in contrast, the voltage drop across them is excessive thus posing a problem of excessive quiescent current flowing in the transistors 17, 18 and FETs 4 and 5.

The circuit of FIG. 3 is for obviating this problem. A third emitter resistor 27 is inserted between the emitter of the drive transistor 17 and the first emitter resistor 23, and the junction point thereof is connected with the base of the first voltage detection transistor 15. A fourth emitter resistor 28 is inserted between the emitter of the other drive transistor 18 and the second emitter resistor 24, and the junction point thereof is connected with the base of the second voltage detection transistor 16. In this circuit configuration, the voltage drop across the resistors 27 and 28 reduces the voltage between the base and emitter of the transistors 15 and 16, thus preventing excessive flow of the quiescent current in the transistors 17, 18 and FETs 4, 5.

This circuit, however, is such that the voltage drop across the resistors 27 and 28 at the time of signal input increases so that the base-emitter voltage of the transistors 15 and 16 may be excessively reduced thereby giving rise to the likelihood of the transistors being cut off. The voltage drop across the resistors 15 and 16 is required to be not excessive.

Figure 4:
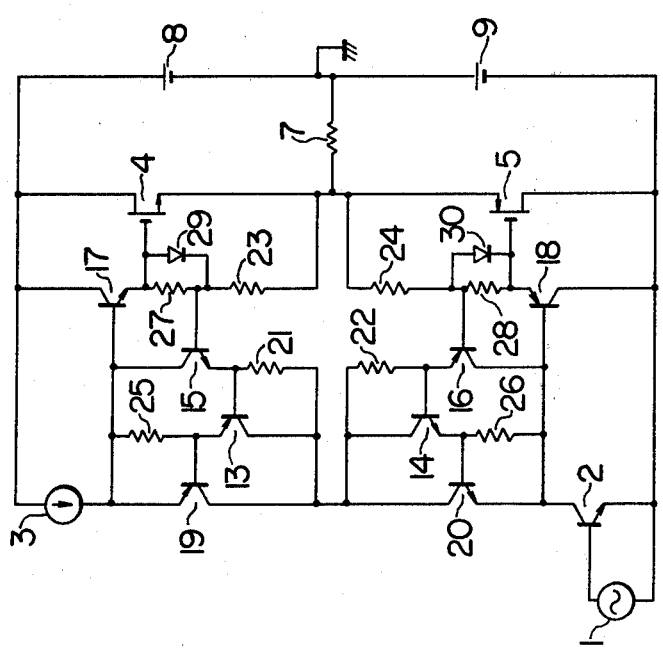
FIG. 4 is a circuit diagram showing an output power amplifier according to still another embodiment of the present invention.

This problem of the circuit of FIG. 3 is overcome by a still another emodiment of the present invention shown in FIG. 4, in which diodes 29 and 30 are connected in parallel to the resistors 27 and 28 respectively. Specifically, in the case where a forward current flows in the diodes 29 and 30, the voltages between the anode and cathode of the diodes 29 and 30 is substantially fixed, with the result that the voltage across the resistors 27 and 28 is fixed by the forward voltage of the diodes 29 and 30. Thus the transistors 15 and 16 are prevented from being cut off.

Figure 5:
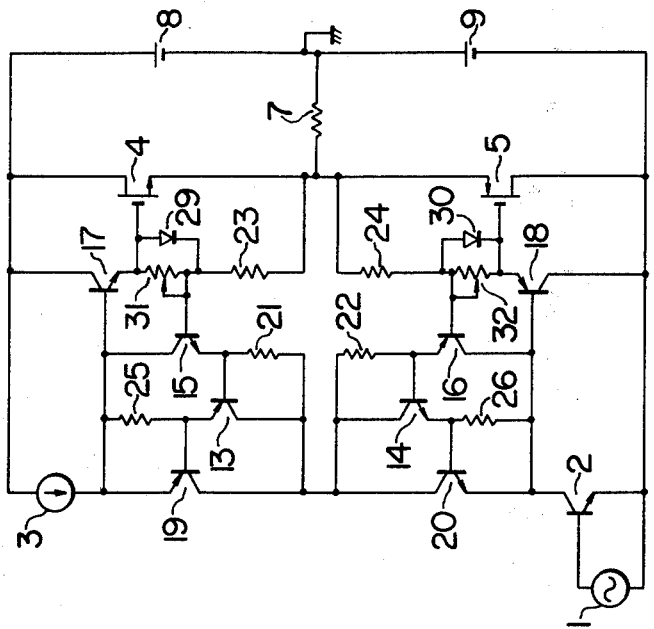
FIG. 5 is a circuit diagram showing an output power amplifier according to a further embodiment of the present invention.

A further embodiment of the present invention is shown in FIG. 5, in which the resistors 27 and 28 in FIG. 4 are replaced by variable resistors 31 and 32. This circuit is capable of regulating the bias current and quiescent current against the variation in the transistors making up the bias circuit. In this drawing, the sum of the base-emitter voltages of the four transistors 13, 14, 19 and 20 and the voltage drop across the resistors 21 and 22 less the base-emitter voltages of the two transistors 17 and 18 is applied between the gates of the MOS FETs 4 and 5, and a quiescent current corresponding to the resulting voltage flows in the output transistors 4 and 5. In order to perform the intended operation in balanced way, it is desirable that the current flowing in the transistors 15 and 16 are equal to each other. For this purpose, the bias current flowing in the transistor 15 can be regulated by a variable resistor 31 and in like manner the bias current flowing in the transistor 16 can be regulated as desired by a variable resistor 32 thereby to make the two currents equal to each other. In this way, the quiescent bias current of the transistors 17, 18 and FETs 4 and 5 are capable of being fixed at a predetermined value.

In spite of this, this circuit is rather complicated in that the bias current and the quiescent bias current are required to be regulated at the same time.

Figure 6:
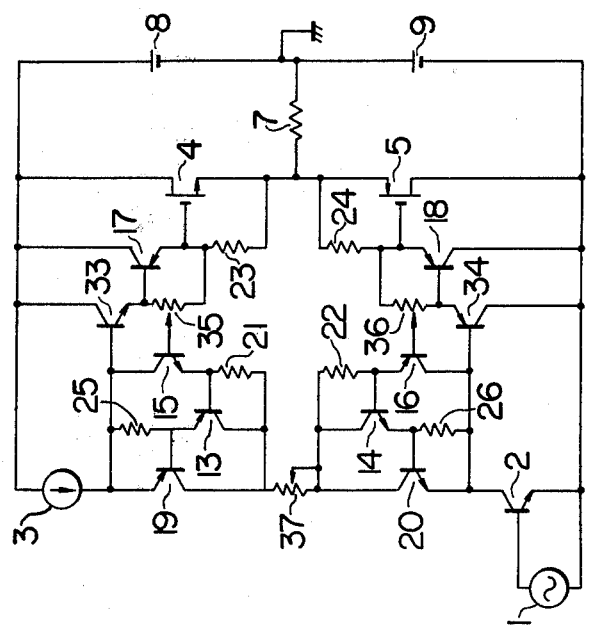
FIG. 6 is a circuit diagram showing an output power amplifier according to a still further embodiment of the present invention.

A still further embodiment of the present invention is shown in FIG. 6, in which the regulation of the bias current of the voltage detection transistor and the quiescent bias current of the output transistor is facilitated. In this circuit, transistors 33 and 34 are added in the stage preceding to the drive transistors 17 and 18, so that only the bias current of the voltage detection transistors 15 and 16 are regulated by resistors 35 and 36. The emitter of the transistor 33 is connected to the base of the transistor 17, and the variable resistor 35 is inserted between the emitter of the transistor 33 and the emitter of the transistor 17. Further, the emitter of the transistor 34 is connected to the base of the transistor 18, and the variable resistor 36 is inserted between the emitter of the transistor 34 and the emitter of the transistor 18. A variable resistor 37 is inserted between the collector of the transistor 19 and the collector of the transistor 20. The variable resistors 35 and 36 are used to regulate the bias currents of the transistors 15 and 16, while the variable resistor 37 is used to regulate the voltage between the bases of the transistors 33 and 34, thus regulating the quiescent bias current of the transistors 17, 18 and the FETs 4 and 5. In this circuit, the quiescent bias current of the transistors 4, 5 and the bias current of the transistors 15, 16 can be regulated easily.

Figure 7:
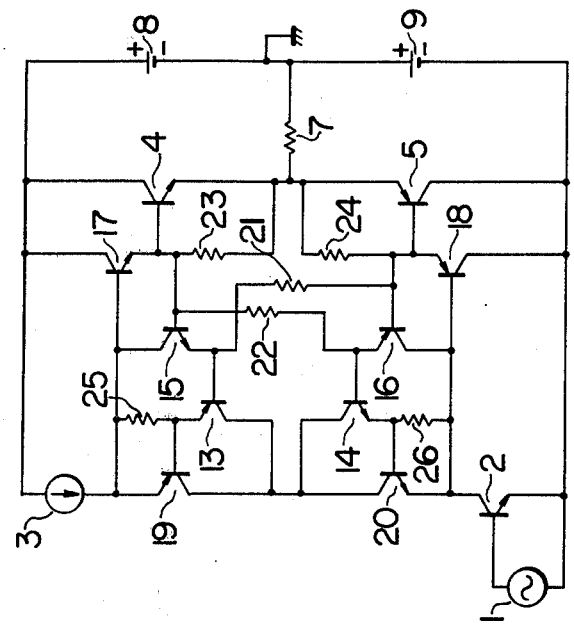
FIG. 7 is a circuit diagram showing an output power amplifier according to a further embodiment of the present invention in which a bipolar transistor is used as an output transistor.

FIG. 7 shows still another embodiment of the output power amplifier circuit according to the present invention in which the MOS FETs are replaced by bipolar transistors as output transistors. The output transistors include an NPN transistor 4 and a PNP transistor 5 each of which operates in emitter-follower fashion. The base-emitter voltages $V_{BE4}$ and $V_{BE5}$ of the bipolar output transistors 4 and 5 are smaller than the gate-source voltage $V_{GS}$ of the MOS FET, and therefore the emitter circuit of the voltage detection transistors 15 and 16 is different from that in the aforementioned embodiments. Specifically, the emitter resistor 21 of the transistor 15 is connected to the base of the transistor 16, and the emitter resistor 22 of the transistor 16 is connected to the base of the transistor 15. This is for the reason that if the two resistors 21 and 22 are connected in series, the voltage applied between the bases of the output transistors 4 and 5 in the absence of signal is excessively high and the quiescent bias current of the output transistors 4 and 5 becomes excessively large, so that the operating point of the output transistors 4 and 5 changes from that for Class B to that for Class A, undesirably reducing the utilization rate of power. In the circuit of FIG. 7, by contrast, the resistors 21 and 22 are connected in parallel to each other, and therefore an excessively high voltage is prevented from being applied between the bases of the transistors 4 and 5 in the absence of signal, thus securing Class B operation.

The operation of this circuit will be explained. When a positive input signal is applied and the emitter voltage of the transistor 17 is increased, the voltage supplied between the base and emitter of the transistor 16 is increased, so that the emitter current increases thus increasing the voltage drop across the resistor 22. The increased part of the voltage across the resistor 22 is applied to the base of the transistor 13 via the base-emitter junction of the transistor 16 and the resistor 21. As a result, the voltage between the bases of the transistors 13 and 14 increases, thus increasing the voltage between the bases of the drive transistors 17 and 18. A current equivalent to the quiescent bias current flow in the output transistor 5, thus preventing the same transistor from being cut off.

It will be understood from the foregoing description that according to the present invention the performance as high as the Class A circuit free from a switching distortion is attained without adversely affecting the efficiency of the Class B circuit and without attenuating the input signal, thus making it possible to supply a large output signal to the load. In view of the fact that the open loop gain of the amplifier is not reduced, it is possible to increase the negative feedback, thus reducing not only switching distortions but also other distortions.

We claim:

1. An audio frequency power amplifier circuit comprising a pair of output transistors of complementary push-pull type, each having an input electrode and an output electrode, a pair of drive transistors connected in emitter-follower fashion to the input electrodes of said pair of output transistors respectively, two series-connected resistors inserted between the emitters of said pair of drive transistors, a pair of voltage detection transistors of different conduction types each having a base, a collector and an emitter, means for applying the voltage between the emitters of said pair of drive transistors across the base-emitter connection of each of said pair of voltage detection transistors, a pair of emitter resistors connected respectively to the emitters of said voltage detection transistors for generating a voltage corresponding to the emitter current of said voltage detection transistors respectively, a pair of constant-voltage sources inserted between the bases of said drive transistors, means for adding the voltages of said emitter resistors to the voltages of said constant-voltage sources respectively, and means for supplying an input signal to the base of each of said drive transistors.

2. An audio frequency power amplifier comprising first and second output transistors of different conduction types each having an input terminal and an output terminal, the output terminals thereof being connected to each other on the one hand and to a common load on the other hand, a first drive transistor connected in emitter-follower fashion to the input terminal of said first output transistor, a second drive transistor connected in emitter-follower fashion to the input terminal of said second output transistor, a first resistor inserted between the emitter of said first drive transistor and the output terminal of said first output transistor, a second resistor inserted between the emitter of said second drive transistor and the output terminal of said second output transistor, a first voltage detection transistor having a base, a collector and an emitter, the collector of said first voltage detection transistor being connected to the base of said first drive transistor, a second voltage detection transistor having a base, a collector and an emitter, the collector of said second voltage detection transistor being connected to the base of said second drive transistor, means for applying the voltage between the emitter of said first drive transistor and the emitter of said second drive transistor across the base-emitter connection of each of said first and second voltage detection transistors, third and fourth resistors connected to the emitters of said first and second voltage detection transistors respectively for generating voltages corresponding to the emitter currents thereof respectively, a first constant-voltage source inserted between the emitter and the collector of said first voltage detection transistor, a second constant-voltage source inserted between the emitter and the collector of said second voltage detection transistor, means for adding the voltage of said first and second constant-voltage sources to the voltage of said third and fourth resistors and applying the resulting sum of said voltages between the bases of said first and second drive transistors, and means for supplying an input signal to each of the base of said first and second drive transistors.

3. An audio frequency power amplifier comprising first and second output transistors of different conduction types each having an input terminal and an output terminal, the output terminals of said first and second output transistors being connected to each other on the one hand and to a common load on the other hand, a first drive transistor of the same conduction type as said first output transistor, said first drive transistor being connected in emitter-follower fashion to said input terminal of said first output transistor, a second drive transistor of the same conduction type as said second output transistor, said second drive transistor being connected in emitter-follower fashion to said input terminal of said second output transistor, a first resistor inserted between the emitter of said first drive transistor and the output terminal of said first output transistor, a second transistor inserted between the emitter of said second drive transistor and the output terminal of said second output transistor, a first voltage detection transistor having a base, an emitter and a collector, said collector being connected to the base of said first drive transistor, said base being connected to the emitter of said first drive transistor, said emitter being connected in DC conductive conduction fashion to the emitter of said second drive transistor, a second voltage detection transistor having a base, an emitter and a collector, said collector being connected to the base of said second drive transistor, said base being connected to the emitter of said second drive transistor, said emitter being connected in DC conductive fashion to the emitter of said first drive transistor, a first constant-voltage source inserted between the emitter and the collector of said first voltage detection transistor, a second constant-voltage source inserted between the emitter and the collector of said second voltage detection transistor, a third resistor connected to the emitter of said first voltage detection transistor for producing a voltage corresponding to the emitter current thereof, a fourth resistor connected to the emitter of said second voltage detection transistor for producing a voltage corresponding to the emitter current thereof, means for supplying the voltages of said first and second constant-voltage sources and the voltages of said third and fourth resistors between the bases of said first and second drive transistors, and means for supplying an input signal to the base of each of said first and second drive transistors.

* * * * *